(12) United States Patent
Bershteyn et al.

(10) Patent No.: US 8,468,009 B1
(45) Date of Patent: Jun. 18, 2013

(54) HARDWARE EMULATION UNIT HAVING A SHADOW PROCESSOR

(75) Inventors: Mikhail Bershteyn, Cupertino, CA (US); Beshara G. Elmufdi, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1391 days.

(21) Appl. No.: 11/541,285

(22) Filed: Sep. 28, 2006

(51) Int. Cl.
  *G06F 9/445* (2006.01)
  *G06F 9/45* (2006.01)

(52) U.S. Cl.
  USPC .............................................. 703/24; 703/23

(58) Field of Classification Search
  USPC .......................................................... 703/24
  See application file for complete search history.

(56) References Cited

U.S. PATENT DOCUMENTS

| | | | | |
|---|---|---|---|---|
| 6,011,730 A | * | 1/2000 | Sample et al. | 365/189.05 |
| 6,618,698 B1 | * | 9/2003 | Beausoleil et al. | 703/23 |
| 6,687,855 B1 | * | 2/2004 | Krech et al. | 714/30 |
| 7,197,627 B1 | * | 3/2007 | Naylor | 712/34 |
| 7,475,288 B2 | * | 1/2009 | Multhaup et al. | 714/28 |
| 2001/0020224 A1 | * | 9/2001 | Tomita | 703/23 |
| 2001/0047253 A1 | * | 11/2001 | Swoboda | 703/26 |

* cited by examiner

*Primary Examiner* — Suzanne Lo
(74) *Attorney, Agent, or Firm* — Holland & Knight LLP; Mark H. Whittenberger, Esq.

(57) ABSTRACT

A hardware emulator having an emulation unit with a shadow processor is described. The shadow processor is capable of performing an extra look up table (LUT) operation in addition to the LUT operation performed by a processor within the emulation unit. The emulation unit comprises a memory for supplying a first amount of data to a shadow processor register, wherein the shadow processor register stores the first amount of data for later retrieval. The data stored in the shadow processor register function as operands for a truth table stored in the memory and are used to select a function bit out from the memory. The selected function bit out represents a Boolean evaluation of the operands.

17 Claims, 4 Drawing Sheets

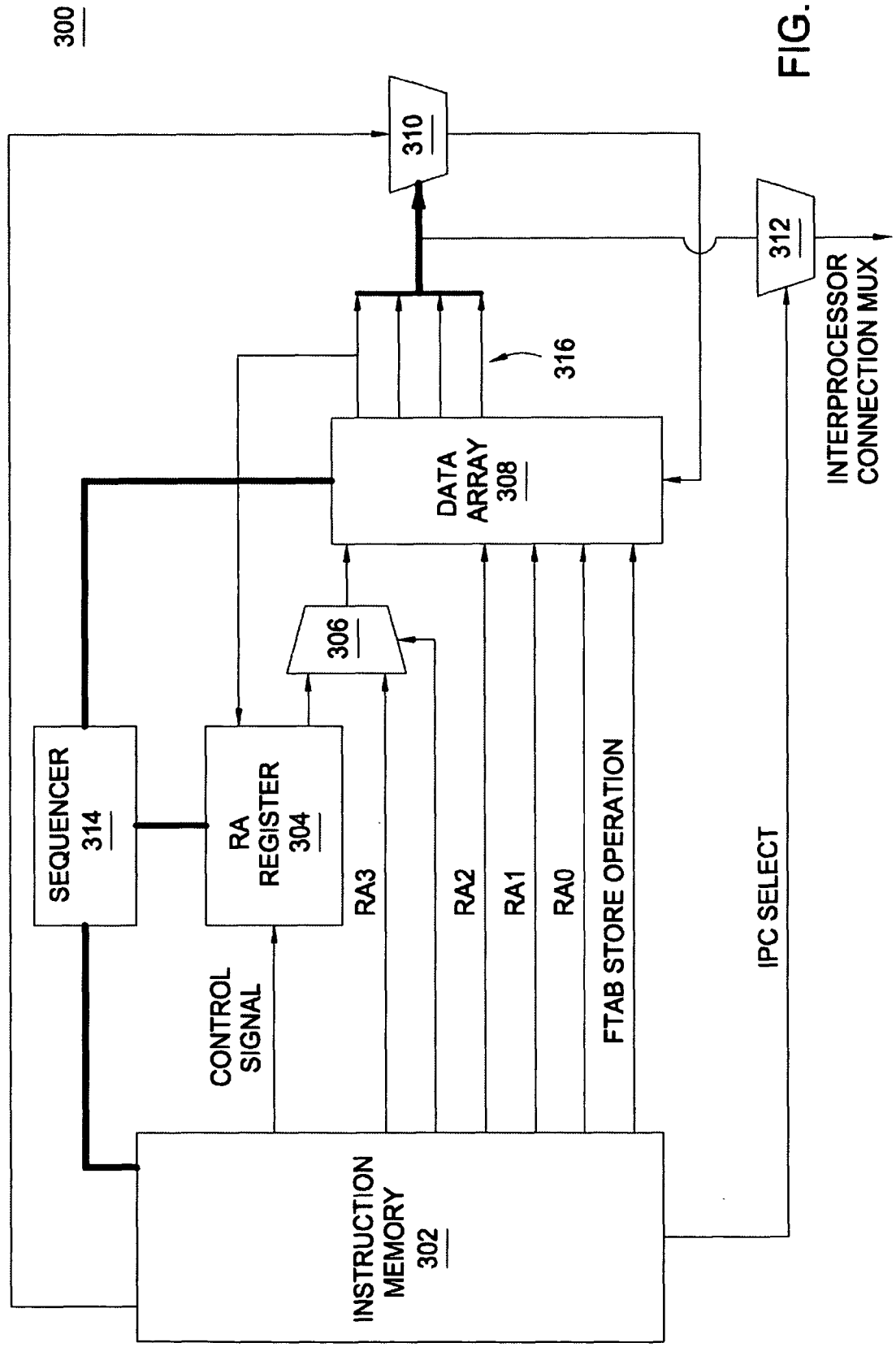

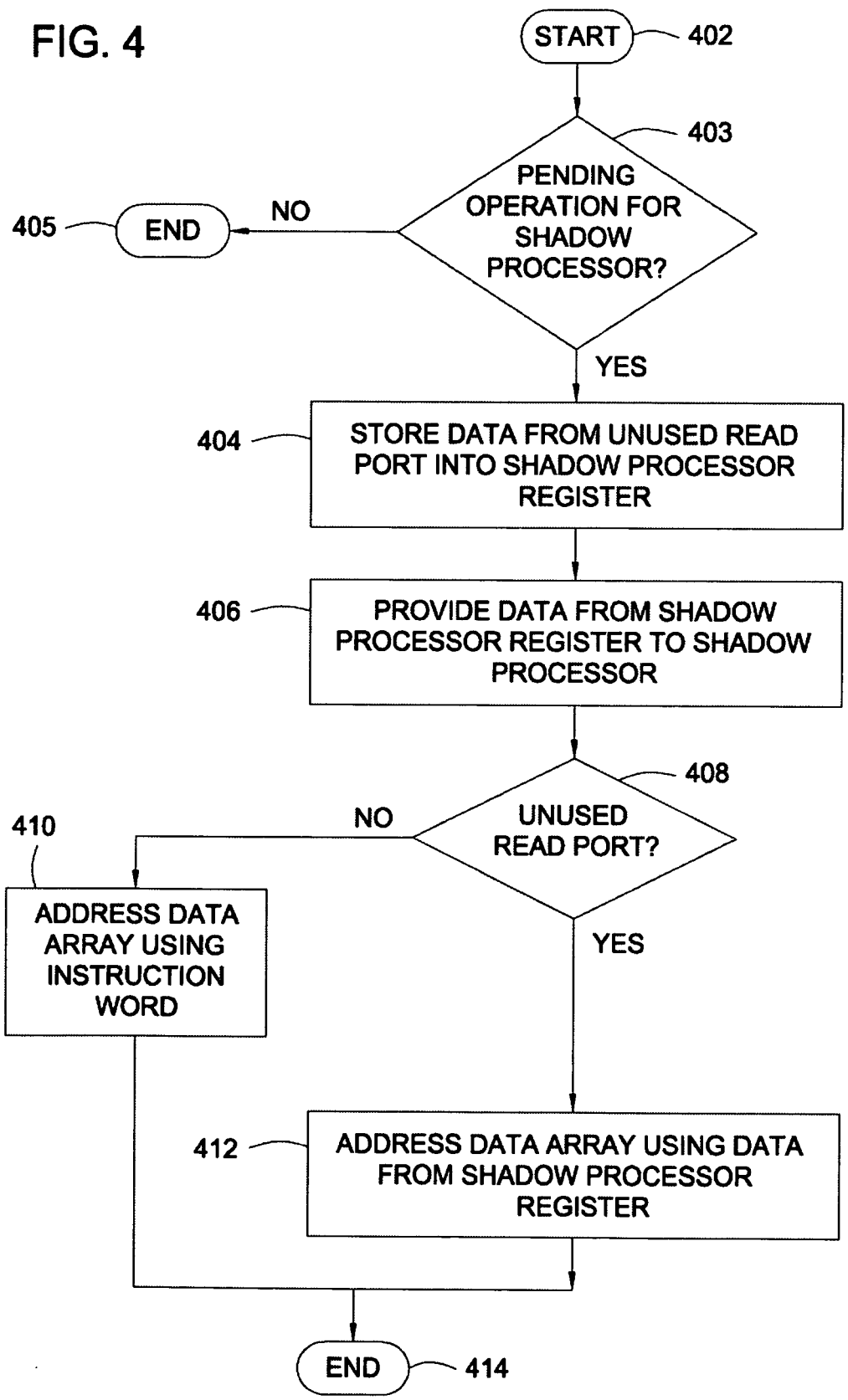

HARDWARE EMULATION UNIT HAVING A SHADOW PROCESSOR

BACKGROUND OF THE INVENTION

1. Field of the Invention

Embodiments of the present invention generally relate to a hardware emulator and, more specifically, a hardware emulation unit having a shadow processor.

2. Description of the Related Art

Hardware emulators are programmable devices used in the verification of hardware designs. A common method of hardware design verification uses processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

A hardware emulator generally comprises a computer workstation for providing emulation support facilities, i.e., emulation software, a compiler, and a graphical user interface to allow a person to program the emulator, and an emulation engine for performing the emulation. The emulation engine is comprised of at least one emulation board, and each emulation board contains individual emulation circuits. Each individual emulation circuit contains multiple emulation processors, and each emulation processor is capable of mimicking a logic gate in each emulation step. Thus, the hierarchy of the emulation engine is an emulation board, multiple emulation integrated circuits, and multiple processors that are part of each emulation integrated circuit.

Each processor is connected to a data array. The data array is a special memory that has multiple read ports and supplies input data to the processor via each read port. The processor evaluates the data supplied from the data array in accordance with an instruction word supplied from an instruction memory. The processor does not always require input data from all of the read ports of the data array. For example, if a data array has four read ports, and a processor is evaluating a function that requires two operands, input data supplied from two out of the four read ports of the data array will be unused by the processor.

The bandwidth of the processor can be calculated by the equation F×N bits/second, where F is the processor clock frequency and N is the number of read ports on the data array that supply input data to the processor. On a four-read port data array, statistically only 2.5 read ports are accessed by the processor during an emulation step. It is well known that processor bandwidth is a significant limiting factor of hardware emulator performance.

Thus, there is a need in the art for a hardware emulator having improved utilization of the available processor bandwidth.

SUMMARY OF THE INVENTION

The present invention generally relates to a hardware emulator and, more specifically, an emulation unit having a shadow processor. The shadow processor is capable of performing an additional LUT operation in addition to the LUT operation performed by a processor within the emulation unit. The emulation unit comprises a data array for supplying a first amount of data to a shadow processor register. The shadow processor register stores the first amount of data for later retrieval and provides at least a portion of the first amount of data to a shadow processor. An instruction memory provides an instruction word and a control signal to the shadow processor. The control signal selects between at least a portion of the first amount of data and the instruction word, wherein at least a portion of the first amount of data and the instruction word functions as a read address for the data array. At least a portion of the first amount of data function as operands for a truth table and are used to select a function bit out from the data array. The selected function bit out represents a Boolean evaluation of the operands. A method for loading the truth table into the data array is also described. The truth table may be preloaded into the data array by a computer workstation that provides emulation support facilities. The truth table may also be loaded dynamically from the instruction memory to the data array during an emulation cycle.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a block diagram of an emulation unit having a shadow processor; and

FIG. 4 is a flow diagram of a method by which an emulation unit can perform an extra look up table (LUT) operation during an emulation step.

DETAILED DESCRIPTION

Figure 1:
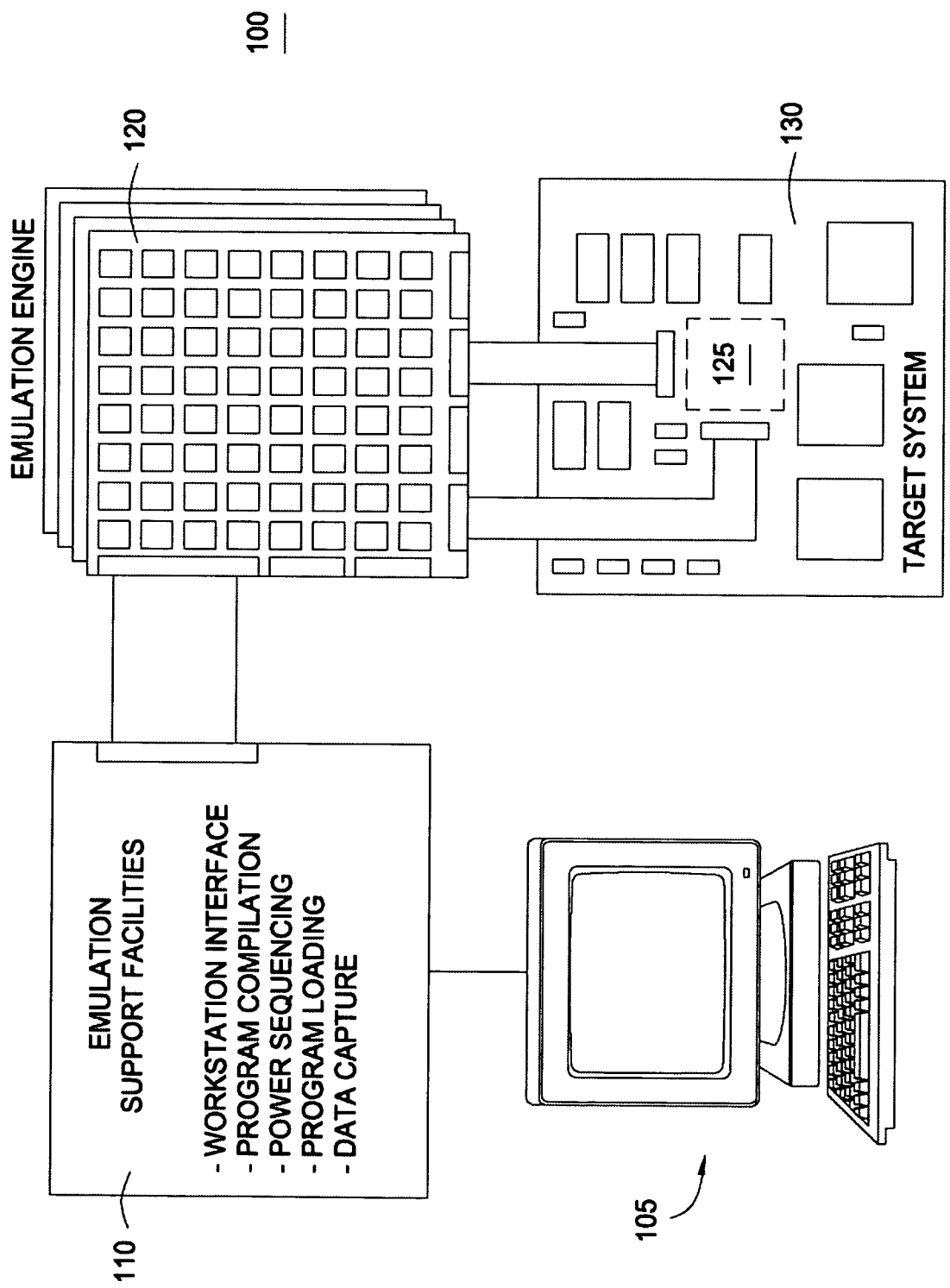
FIG. 1 is an overview of a hardware emulation system.

The present invention is a hardware emulator having a plurality of emulation units that can utilize a shadow processor to evaluate data. Each emulation unit includes a processor for evaluating data supplied from a data array. The data array is a memory that has multiple read ports and a single write port. The processor does not always utilize each read port FIG. 1 is an overview of an emulation system 100. The system comprises a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Under control of the computer workstation 105, programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
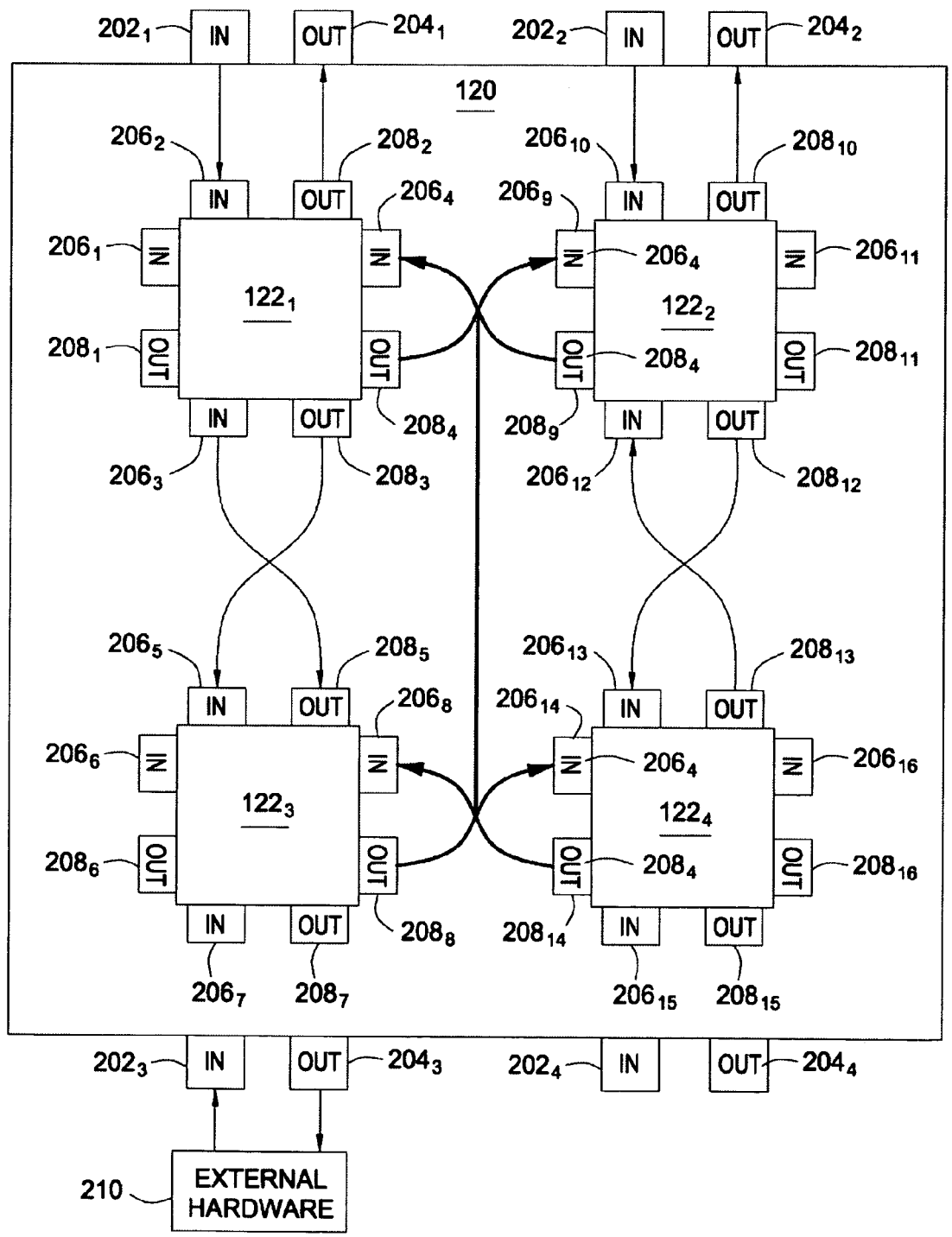
FIG. 2 is a functional block diagram of an emulation engine.

FIG. 2 is a block diagram of an emulation board 120. The emulation board 120 is comprised of individual emulation circuit groups $122_1$ to $122_4$ (collectively 122). The emulation board 120 has board inputs $202_1$ to $202_4$ (collectively 202) and board outputs $204_1$ to $204_4$ (collectively 204). The board inputs 202 and outputs 204 allow the emulation board 120 to connect to other emulation boards (not shown) and to external hardware 210. The external hardware 210 may be a VLSI circuit, a debugger, a memory, or any combination of hardware and software from which the emulation circuit group 122 can benefit.

Each emulation circuit group 122 has multiple inputs 206, and multiple outputs $208_n$ (where n is an integer). The outputs 208 of each emulation circuit group 122 connect directly to the inputs 206 of the other emulation circuit groups 122 present on the emulation board 120 or the outputs of the board 204.

FIG. 3 is a block diagram of an emulation unit 300 having a shadow processor 306. The emulation unit 300 comprises an instruction memory 302, a shadow processor register 304, a shadow processor 306, a data array 308, a processor 310, an interprocessor connection multiplexer 312, and a sequencer 314.

The processor 310 is a fundamental component of the emulation engine 120. The processor 310 has multiple input ports for receiving data from the data array 308 and a single output port for providing evaluated data to the data array 308. The processor's primary function is to execute an N-input logical function (where N is an integer) and produce a single bit result known as a function bit out. The processor 310 evaluates data received from the data array 308 using a control store word (CSW) supplied from the instruction memory 302 to produce a function bit out (FBO). The resulting function bit out may correspond to any one of: a logic gate output of the emulated design, a register output of the emulated design, a synthesized intermediate logic state, or a control bit generated for the emulation process.

The data array 308 is a memory that stores the output of the processor 310. The write address for the data array 308 is provided by the sequencer 314. The data array 308 has n write ports, where n is equal to the number of processors 310, and nxy read ports, where n is equal to the number of processors 310 and y is equal to the number of inputs into each processor 310. Each processor 310 is capable of accessing data stored in the data array 308 by another processor 310 during one emulation cycle.

The instruction memory 302 stores instruction words, also referred to as control store words (CSW). The instruction memory 302 is coupled to the sequencer 314, the processor 310, the shadow processor register 304, the shadow processor 306, the data array 308, and the interprocessor connection multiplexer 312. The instruction memory 302 receives read addresses from the sequencer 314 and provides instruction words to the processor 310. The instruction words control the operation of the processor 310. In one embodiment of the invention, the instruction memory 302 loads a function table (FTAB) into the data array 308. The instruction memory 302 also provides a control signal to the shadow processor register 304 that causes a stored amount of data to be provided from the shadow processor register 304 to the shadow processor 306.

The sequencer 314 supplies timing information to the emulation unit 300, provides read addresses to the instruction memory 302 and provides sequential write addresses to the data array 308. The sequencer 314 starts at an initial value and increments to a maximal value. Each increment of the sequencer 314 causes the step value to advance from zero towards the maximal value and is equivalent to an emulation step. Collectively, all of the emulation steps form one emulation cycle. An emulation cycle is complete once the sequencer 314 reaches its maximal value. Upon reaching its maximal value, the sequencer 314 begins counting again from its initial value and a new emulation cycle is initiated.

The shadow processor register 304 stores data supplied from the data array 308 using a write address contained in the CSW. The data array 308 has multiple read ports, e.g., four read ports, that provide input data to the processor 310. The processor 310 has multiple input ports 316, one input port corresponding to each read port of the data array. The processor 310 does not always require all of the input data supplied from the data array 308. For example, if the data array 308 has four read ports, during an emulation step the processor 310 may utilize data supplied from only three read ports of the data array 308. The data from the fourth read port (the unutilized read port) is stored in the shadow processor register 304 for later use and retrieval. In one embodiment of the invention, the shadow processor register stores twelve bits for addressing a truth table stored in memory. The memory for the truth table may be memory dedicated to the shadow processor, any memory space available in the emulation unit, or a portion of the data array. In the depicted embodiment, the data array is used to store the truth table. The twelve bits stored in the shadow processor register 304 enable the shadow processor 306 to address a truth table of 4096 bits.

The shadow processor 306 receives as input, data stored in the shadow processor register 304, e.g., the twelve bits, and an instruction word supplied from the instruction memory 302. The shadow processor also receives a control signal supplied from the instruction memory 302 that selects between the data supplied from the shadow processor register 304 and the instruction word. In one embodiment of the invention, the shadow processor 306 is a multiplexer.

During a normal mode of operation of the emulation unit 300, i.e., an extra LUT operation is not being performed during the current emulation step, the shadow processor selects as an output the instruction word supplied from the instruction memory 302. During an extra LUT operation of the emulation unit 300, the shadow processor 306 selects as an output the data supplied from the shadow processor register 304.

The interprocessor connection multiplexer 312 supplies data from the emulation unit 300 to other emulation units under the control of the instruction memory 302. The data supplied to the other emulation units may supplied from the data array 308 or an output bit generated during the performance of the extra LUT operation.

FIG. 4 is a flow diagram of a method 400 by which an emulation unit 300 can perform an extra look up table (LUT) operation during an emulation step. The method 400 utilizes data stored in a shadow processor register 304 to address a truth table stored in at least a portion of the data array 308. The method 400 assumes the truth table is already loaded into the data array 308. In one embodiment of the invention, the truth table is preloaded into the data array 308 prior to an emulation cycle by a computer workstation 105 providing emulation support facilities 110.

In another embodiment of the invention, the truth table is dynamically loaded from an instruction memory 302 into the data array 308 during an emulation cycle. The instruction memory 302 comprises instruction words. Each instruction word is divided into a plurality of fields. The truth table is contained within one of the plurality of fields of an instruction word. When an operation to load the truth table from the instruction memory 302 to the data array 308 is enabled, the truth table is copied from the instruction word into the data array 308. In this embodiment, the truth table is copied to an unused portion of the data array 308, i.e., a portion of the data array 308 specifically set aside for storing truth tables copied from the instruction words supplied by the instruction memory 302.

The method 400, starts at block 402 and proceeds to block 403. At block 403, the method 400 queries whether there is a pending operation for the shadow processor. If the query is negatively answered, the method 400 ends at block 405. If the query is affirmatively answered, the method 400 proceeds to step 404 to begin using the shadow processor. At block 404, a first amount of data is stored from the data array 308 into a shadow processor register 304. The first amount of data is stored during an emulation step when a processor 310 within the emulation unit 300 does not require all of the input data supplied from each read port of the data array 308. The unused input data is stored in the shadow processor register 304. In one embodiment of the invention, the shadow processor register 304 stores 12 bits of data. Once the shadow processor register 304 is full, i.e., contains 12 bits of data, the shadow processor register 304 can be utilized by the emulation unit 300 to perform an extra LUT function during an emulation step. The remainder of the method 400 assumes the shadow processor register 304 is full and can be utilized by the emulation unit 300 to perform this extra LUT function.

At block 406, the shadow processor register 304 supplies the stored data to a shadow processor 306. In one embodiment of the invention, the shadow processor 306 is a multiplexer. The shadow processor 306 receives as input the data from the shadow processor register 304, an instruction word from the instruction memory 302, and a selection signal from the instruction memory 302. The shadow processor 306 uses the selection signal to select between the data from the shadow processor register 304 and the instruction word.

At decision block 408, a determination is made as to whether the processor unit 310 requires all of the input data supplied from the data array 308 during a current emulation step. If the processor 310 does not require all of the input data, i.e., a read port from the data array 308 is not utilized by the processor 310 during the current emulation step, then the data from the shadow data register 304 is selected from the shadow processor 306 by the control signal and the method 400 proceeds to block 412. If the processor 310 requires all of the input data supplied from the data array 308, i.e., all of the input data supplied from the data array 308 is under evaluation by the processor 310 during the current emulation step, then the instruction word supplied by the instruction memory 302 is selected and the method 400 proceeds to block 410.

At block 410, the emulation unit 300 utilizes the instruction word supplied from the instruction memory 302 to read data from the data array. This is the normal operating procedure for the emulation unit 300, i.e., an extra LUT operation is not performed during the emulation step.

At block 412, the emulation unit 300 utilizes the data, or at least a portion of the data, supplied from the shadow processor register 304 to address a truth table stored in at least a portion of the data array 308. The data supplied from the shadow processor register 304 function as operands that are evaluated as Boolean functions by the truth table. The truth table within the data array 308 produces an output bit that is the evaluated Boolean function of the operands supplied from the data, i.e., the data stored in the shadow processor register 304. The output bit from the truth table may then be supplied to the processor 310 for further evaluation, or supplied to an interprocessor connection multiplexer 312. The method 400 ends at block 414.

The present invention provides the advantage of increasing the efficiency of processor bandwidth by enabling an emulation unit to perform an extra LUT operation during an emulation step where a processor in the emulation unit does not utilize all of the data supplied from a data array. Processor bandwidth is one of the most significant factors that effect computational efficiency of a hardware emulator. By storing unused data in a register, the unused data can be used at a later emulation step by a shadow processor to perform the extra LUT operation. Thus, data that is not evaluated by the processor can be utilized at a later time to perform an extra LUT operation, enabling the emulation unit to perform at least two LUT operations during certain emulation steps.

While the foregoing is directed to embodiments of the present invention, other and further embodiments of the invention may be devised without departing from the basic scope thereof, and the scope thereof is determined by the claims that follow.

What is claimed is:

1. A hardware emulator having a plurality of emulation units, each emulation unit comprising:
    a processor;
    a memory having a plurality of read ports coupled to the processor;
    a shadow processor register coupled to a read port of the plurality of read ports, the shadow processor register storing a first amount of data received from the memory via the read port;
    a shadow processor, coupled to the shadow processor register and the memory,
    for addressing data within the memory; and
    an instruction memory configured to provide an instruction word and a control signal to the shadow processor, the instruction memory being further configured to provide a truth table in a field of another instruction word dynamically to the memory, where the control signal causes the shadow processor to select between the at least a portion of the first amount of data in the shadow processor register and the instruction word, wherein the at least a portion of the first amount of data and the instruction word function as a read address for the memory.

2. The hardware emulator of claim 1, wherein the truth table is addressable by the at least a portion of the first amount data.

3. The hardware emulator of claim 2, wherein the at least a portion of the first amount of data comprises a plurality of operands of a Boolean function.

4. The hardware emulator of claim 3, wherein an output bit of the truth table is an evaluated value of the plurality of operands of the Boolean function.

5. The hardware emulator of claim 4, wherein the output bit of the truth table is further provided to a processor within the emulation unit.

6. The hardware emulator of claim 4, wherein the output bit of the truth table is further provided to an interprocessor connection multiplexer.

7. The hardware emulator of claim 1 wherein the memory comprises at least a portion of a data array.

8. The hardware emulator of claim 1, wherein the shadow processor is a multiplexer.

9. A method for performing an extra lookup table operation during an emulation step comprising:
    supplying input data to a processor from a memory using a plurality of read ports of the memory in a first emulation cycle;
    storing a first amount of data in a shadow processor register using another read port of the memory in the first emulation cycle, wherein at least a portion of the first amount of data function as a plurality of operands of a Boolean function for a truth table;

providing, from an instruction memory, an instruction word and a control signal to the shadow processor, the instruction memory being further configured to provide a truth table in a field of another instruction word dynamically to the memory; and selecting an output bit from the truth table, where the output bit is an evaluated value of the plurality of operands of the Boolean function.

10. The method of claim 9, further comprising providing a control signal to the shadow processor register, wherein the control signal enables the shadow processor register to store the first amount of data.

11. The method of claim 9, further comprising:

supplying the at least a portion of the first amount of data to a shadow processor;

supplying another instruction word from the instruction memory to the shadow processor, wherein the other instruction word functions as a read address for the memory; and selecting between the at least a portion of the first amount of data and the instruction word.

12. The method of claim 9, further comprising providing the output bit from the truth table to a processor.

13. The method of claim 9, further comprising providing the output bit from the truth table to an interprocessor selection multiplexer.

14. A non-transitory computer readable medium comprising a computer readable program, wherein the computer readable program when executed on a computer causes the computer to perform operations of:

supplying input data to a processor from a memory using a plurality of read ports of the memory in a first emulation cycle;

storing a first amount of data in a shadow processor register using another read port of the memory in the first emulation cycle, wherein at least a portion of the first amount of data function as a plurality of operands of a Boolean function for a truth table;

providing, from an instruction memory, an instruction word and a control signal to the shadow processor, the instruction memory being further configured to provide a truth table in a field of another instruction word dynamically to the memory; and selecting an output bit from the truth table, where the output bit is an evaluated value of the plurality of operands of the Boolean function.

15. The computer readable medium of claim 14, further comprising providing a control signal to the shadow processor register, wherein the control signal enables the shadow processor register to store the first amount of data.

16. The computer readable medium of claim 14, further comprising supplying the at least a portion of the first amount of data to a shadow processor;

supplying another instruction word from the instruction memory to the shadow processor, wherein the other instruction word functions as a read address for the memory; and selecting between the at least a portion of the first amount of data and the instruction word.

17. The computer readable medium of claim 14, further comprising providing the output bit from the truth table to a processor.

* * * * *